(12) United States Patent
Rodriguez Echevarria et al.

(10) Patent No.: US 12,352,789 B2
(45) Date of Patent: Jul. 8, 2025

(54) DEVICE, METHOD AND SYSTEM TO INDICATE AN AMOUNT OF A LOAD CURRENT PROVIDED BY POWER SUPPLY UNITS

(71) Applicant: Intel Corporation, Santa Clara, CA (US)

(72) Inventors: Aurelio Rodriguez Echevarria, Zapopan (MX); Juan Antonio Orozco Ramirez, Zapopan (MX)

(73) Assignee: Intel Corporation, Santa Clara, CA (US)

( * ) Notice: Subject to any disclaimer, the term of this patent is extended or adjusted under 35 U.S.C. 154(b) by 775 days.

(21) Appl. No.: 17/483,648

(22) Filed: Sep. 23, 2021

(65) Prior Publication Data

US 2023/0088725 A1    Mar. 23, 2023

(51) Int. Cl.
*G01R 21/00*    (2006.01)
*G05F 1/625*    (2006.01)

(52) U.S. Cl.
CPC ........... *G01R 21/006* (2013.01); *G05F 1/625* (2013.01)

(58) Field of Classification Search
CPC .............................. G01R 21/006; G05F 1/625
See application file for complete search history.

(56) References Cited

U.S. PATENT DOCUMENTS

| 10,095,296 B2 * | 10/2018 | Mirjafari | G06F 1/3296 |
| 2020/0033925 A1 * | 1/2020 | Young | G06F 1/28 |

FOREIGN PATENT DOCUMENTS

| CN | 106888100 A | * | 6/2017 | ............ H04L 12/10 |
| GB | 2484012 A | | 3/2012 | |
| KR | 101935684 B1 | * | 1/2019 | |
| WO | 2019/182603 A1 | | 9/2019 | |

OTHER PUBLICATIONS

Extended European Search Report and Search Opinion, EP App. No. 22189239.1, Feb. 7, 2023, 8 pages.

* cited by examiner

*Primary Examiner* — Lincoln D Donovan
*Assistant Examiner* — James G Yeaman
(74) *Attorney, Agent, or Firm* — NICHOLSON DE VOS WEBSTER & ELLIOTT LLP

(57) ABSTRACT

Techniques and mechanisms for providing power telemetry information which indicates a total load current from one or more power supply units (PSUs). In an embodiment, a device is coupled to receive a first signal from the current share bus which is coupled to each of multiple PSUs. A voltage level of the first signal represents a target amount of current to be output by each of the one or more PSUs. A second signal is generated based on both the first signal, and on an indication of a scale according to which a primary PSU of the one or more PSUs represents a target amount of current. In another embodiment, an amplification is performed, based on the second signal and on a total number of the one or more PSUs, to generate an Isys signal which indicates a total load current output by the one or more PSUs.

20 Claims, 7 Drawing Sheets

| Scenario | Vld 712 (V) | Idps 702 | Vsc 732 (V) | PWOK1 704a | PWOK2 704b | PWOK3 704c | XC factor (x 150 µA/V) | Isys 752 (µA) |
|---|---|---|---|---|---|---|---|---|
| 1 | 3.0 | PS1 | 4.0 | 1 | 0 | 0 | 1 | 600 |
| 2 | 4.0 | PS2 | 4.0 | 0 | 1 | 1 | 2 | 1200 |
| 3 | 4.0 | PS3 | 3.2 | 0 | 0 | 1 | 1 | 480 |
| 4 | 6.0 | PS1 | 8.0 | 1 | 1 | 0 | 2 | 2400 |
| 5 | 8.0 | PS3 | 6.4 | 1 | 0 | 1 | 2 | 1920 |
| 6 | 10.0 | PS3 | 8.0 | 1 | 1 | 1 | 3 | 3600 |

Vld (PS1): 20.0 A/V scale
Vld (PS2): 15.0 A/V scale
Vld (PS3): 12.0 A/V scale
Isys: 10 µA/A scale f1(PS1): (20)/(15) = 1.333
f1(PS2): (15)/(15) = 1.0
f1(PS3): (12)/(15) = 0.8

DEVICE, METHOD AND SYSTEM TO INDICATE AN AMOUNT OF A LOAD CURRENT PROVIDED BY POWER SUPPLY UNITS

BACKGROUND

1. Technical Field

This disclosure generally relates to power supply management and more particularly, but not exclusively, to the provisioning of information which indicates a total load current from multiple power supply units.

2. Background Art

Power supply systems are variously used to facilitate operation of personal computers, servers, network devices, and the like. Often, these devices require an uninterrupted supply of power to enable reliable service. To facilitate such an uninterrupted supply of power, redundant power supply units are usually provided to increase the likelihood of one or more power supply units being available at any given time.

In various power management technologies, such as hardware-based power capping, dedicated processor hardware and firmware (Pcode) are used—rather than executing software—to implement any of various power control algorithms. These technologies often rely on the Pcode receiving, from system hardware, telemetry information which describes characteristics of system power consumption. In a typical power capping solution, Pcode obtains system power telemetry from a voltage regulator controller (VRC) via a serial voltage ID (SVID) interface. As successive generations of integrated circuit technologies continue to scale in size and power efficiency, there is expected to be an increasing premium placed on improvements to the provisioning of such telemetry information.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1:
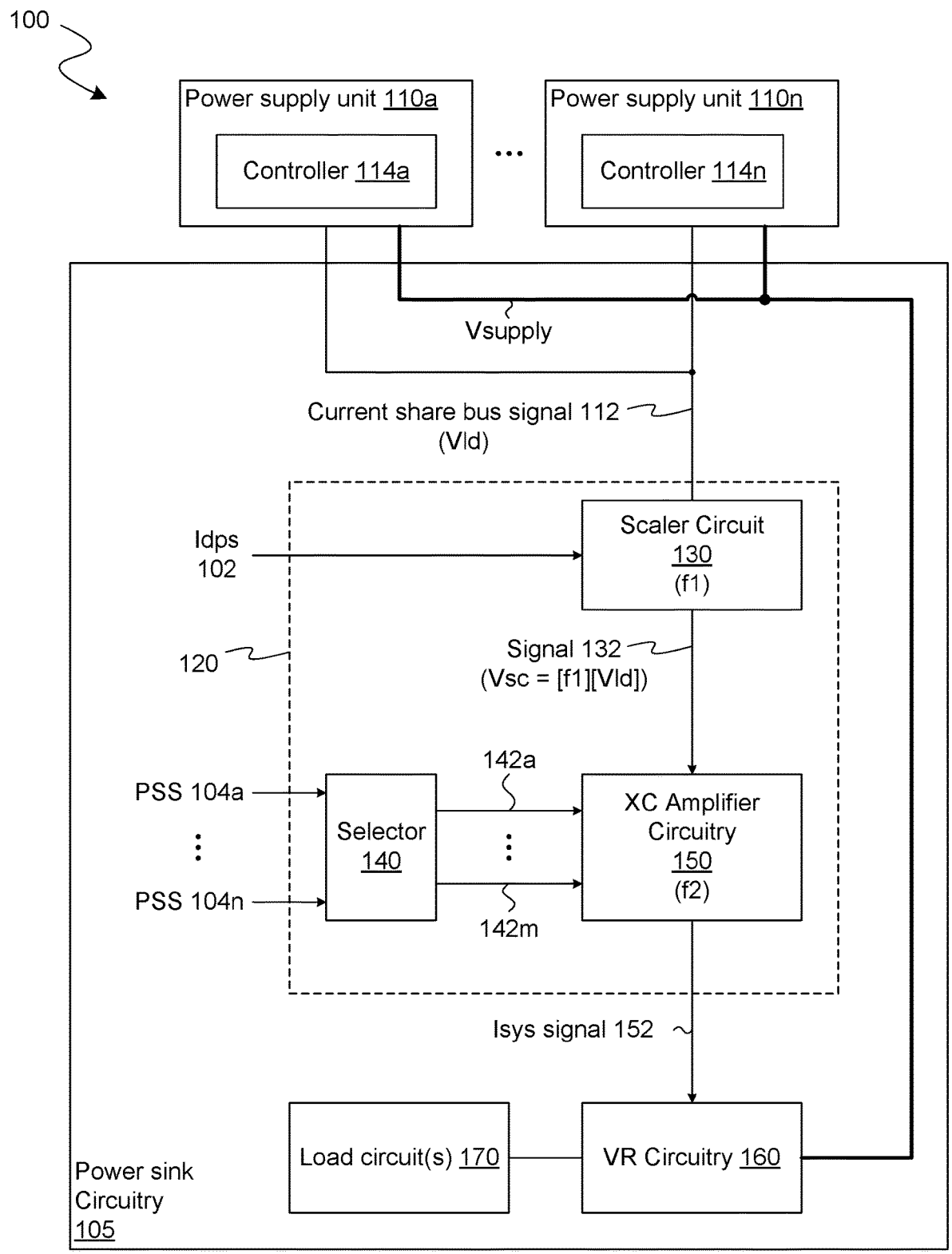
FIG. 1 shows a functional block diagram illustrating features of a system to generate power delivery information according to an embodiment.

Embodiments discussed herein variously provide techniques and mechanisms for providing power telemetry information which indicates a total load current provided with multiple power supply units. In the following description, numerous details are discussed to provide a more thorough explanation of the embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

It is to be understood that the terms so used are interchangeable under appropriate circumstances such that the embodiments of the invention described herein are, for example, capable of operation in other orientations than those illustrated or otherwise described herein.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. It is pointed out that those elements of a figure having the same reference numbers (or names) as the elements of any other figure can operate or function in any manner similar to that described, but are not limited to such.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices which include, or otherwise support operation with, multiple power supply units.

Some embodiments variously provide structures to efficiently identify to a voltage regulator (or other suitable circuit resource) an amount of a total load current output by one or more power supply units (PSUs) of a multiple redundant PSUs. At a given time, a PSU is in one of two states—including what is referred to herein as a "compliant state" and a "non-compliant state"—which determine whether the PSU is able to participate in power delivery. In this particular context, "compliant state" refers herein to the characteristic of a PSU satisfying a respective one or more requirements for delivering power to a power given sink. For example, such one or more requirements include an output voltage, a load current capacity, and/or any of various other such operational characteristics each being within a respective specified range. By contrast, "non-compliant state" refers herein to the characteristic of a PSU failing to satisfy some or all of said respective one or more requirements.

For brevity, a PSU which is in a compliant state is referred to herein as a "compliant PSU" whereas a PSU which is in a non-compliant state is referred to hear in as a "non-compliant PSU." Moreover, as used herein in the context of power supply units, "compliance state information" refers to a signal, data value, or other such information which specifies or otherwise indicates whether or not a given power supply unit is currently in a compliant state (or alternatively, in a non-compliant state)

In various environments, PSUs support functionality to share a total current load evenly among those one or more compliant PSUs which are to participate in power delivery. Such current sharing functionality comprises, or otherwise operates based on, a designating of a first compliant PSU which is to identify a target load current. The target load current is an amount of current which will be provided by the first compliant PSU, and will be matched by each of any other compliant PSUs. In this particular context, the designated first compliant PSU is referred to herein as a "primary PSU", and any other compliant PSU is referred to herein as a "secondary PSU."

By way of illustration and not limitation, a given PSU is determined to be designated as a primary PSU based on that given PSU being a first PSU to enter a compliant state after a power up boot up or other such event. Alternatively, a given PSU is designated to be the primary PSU based on an arbitration and/or other communications between multiple compliant PSUs. However, some embodiments are not limited to a particular basis on which any one PSU is designated to be a primary PSU (or alternatively, a secondary PSU).

Current sharing functionality is facilitated by a bus (referred to herein as a "current share bus") which is coupled to each of one or more other PSUs, where in the a given primary PSU communicates a target current load to any other compliant PSU via said bus.

FIG. 1 shows features of a system 100 to generate power delivery information according to an embodiment. System 100 illustrates one example of an embodiment wherein a signal, representing a total load current provided by some or all of multiple PSUs, is generated based on information communicated via a current share bus which is coupled to the multiple PSUs.

As shown in FIG. 1, system 100 comprises an arrangement of redundant power supply units, such as the illustrative power supply units (PSUs) 110a, ..., 110n shown. The PSUs 110a, ..., 110n are coupled to provide power to one or more load circuits 170—e.g., wherein power is delivered using a supply voltage Vsupply provided to voltage regulator (VR) circuitry 160 by one or more compliant PSUs. VR circuitry 160 regulates power delivery to one or more load circuits 170 with Vsupply. In some embodiments, Vsupply is also provided directly to some or all of the one or more load circuits 170

To facilitate management of the power to be provided by the power supplies, some embodiments provide VR circuitry 160 with an Isys signal 152. In this particular context, "Isys signal" refers to herein to a signal which corresponds to a supply voltage, wherein an amount of the current of the Isys signal represents a scaled version of a total load current which is output by the one or more compliant PSUs in provisioning that supply voltage. In an embodiment, Isys signal 152 is generated with circuitry 120 based on a signal 112 which circuitry 120 receives from the current share bus.

Although some embodiments are not limited in this regard, circuitry 120 comprises amplifier circuitry—e.g., including scaler circuit 130 and/or transconductance (XC) amplifier circuitry 150—which supports coupling to each of multiple PSUs 110a, ..., 110n via the current share bus. The amplifier circuitry is coupled to receive signal 112 from the current share bus—e.g., wherein a voltage level (Vld) of signal 112 indicates a target amount of current to be output by each of one or more power supply units of the multiple PSUs 110a, ..., 110n. For example, PSUs 110a, ..., 110n comprise respective controllers 114a, ..., 114n which are configured to communicate with each other via the Ishare bus and/or other suitable interconnect structures—e.g., to identify a primary PSU, a target amount of per-PSU load current, and/or other state information related to operation of PSUs 110a, ..., 110n.

In one such embodiment, circuitry 120 further comprises—or alternatively, is to couple to—a selector 140 which receives one or more signals (such as the illustrative signals PSS 104a, ..., PSS 104n shown) that provide compliance state information for the multiple PSUs 110a, ..., 110n. For example, signals PSS 104a, ..., PSS 104n correspond to PSUs 110a, ..., 110n (respectively), wherein each of signals PSS 104a, ..., PSS 104n indicates whether the corresponding PSU is in a compliant state to participate in power delivery to the one or more load circuits 170.

Selector 140 determines, based on signals PSS 104a, ..., PSS 104n, a total number of the one or more PSUs which are in a compliant state. In an embodiment, selector 140 provides to the amplifier circuitry one or more signals (such as the illustrative signals 142a, ..., 142m shown) which indicate a scale factor f2 based on the total number.

In the example embodiment shown, amplifier circuits of circuitry 120 comprises a scaler circuit 130 which is further coupled to receive one or more signals (e.g., comprising the illustrative signal Idps 102 shown) which are to identify a first power supply unit (PSU) of PSUs 110a, ..., 110n as being a source of signal 112. For example, signal Idps 102 specifies or otherwise indicates that the first PSU has been designated a primary PSU of the one or more compliant PSUs.

Scaler circuit 130 amplifies signal 112 based on Idps 102—e.g., by performing a voltage amplification with a scale factor f1—to generate another signal 132. In various embodiments, a voltage level Vsc of signal 132 represents a scaled version of voltage level Vld—e.g., wherein scale factor f1 is less than one (1). XC amplifier circuitry 150 then performs a transconductance amplification of signal 132—based on signals 142a, ..., 142m—to generate Isys signal 152.

In some alternative embodiments, circuitry 120 omits scaler circuit 130—e.g., wherein signal 112 is provided directly to XC amplifier circuitry 150, and Isys signal 152 is generated by a transconductance amplification of signal 132. In one such embodiment, omission of scaler circuit 130 is facilitated by each of PSUs 110a, ..., 110n using the same scale to represent a target amount of current—e.g., where the scale is equal to a reference (Amperes-to-Volts) scale for any signal which is to be subjected to amplification with XC amplifier circuitry 150.

Although some embodiments are not limited in this regard, circuitry 120, VR circuitry 160 and one or more load circuits 170 are shown as being devices of power sink circuitry 105—e.g., wherein said devices are variously formed in or on a motherboard or other such printed circuit board (PCB). By providing circuitry 120 with access to the Ishare bus to receive signal 112, some embodiments variously provide a more efficient technique to determine a total current load which is output with one or more PSUs.

For example, some existing techniques variously include a resistor located along the path by which voltage Vsupply is provided to VR circuitry 160. Additionally, measurement circuitry is provided to measure a voltage drop across said resistor. These techniques variously rely on the resistor being small, and the measurement circuitry being able to measure small voltage differences with high accuracy. As a result, these techniques tend to be associated with reduced space efficiency, and additional costs.

Figure 2:
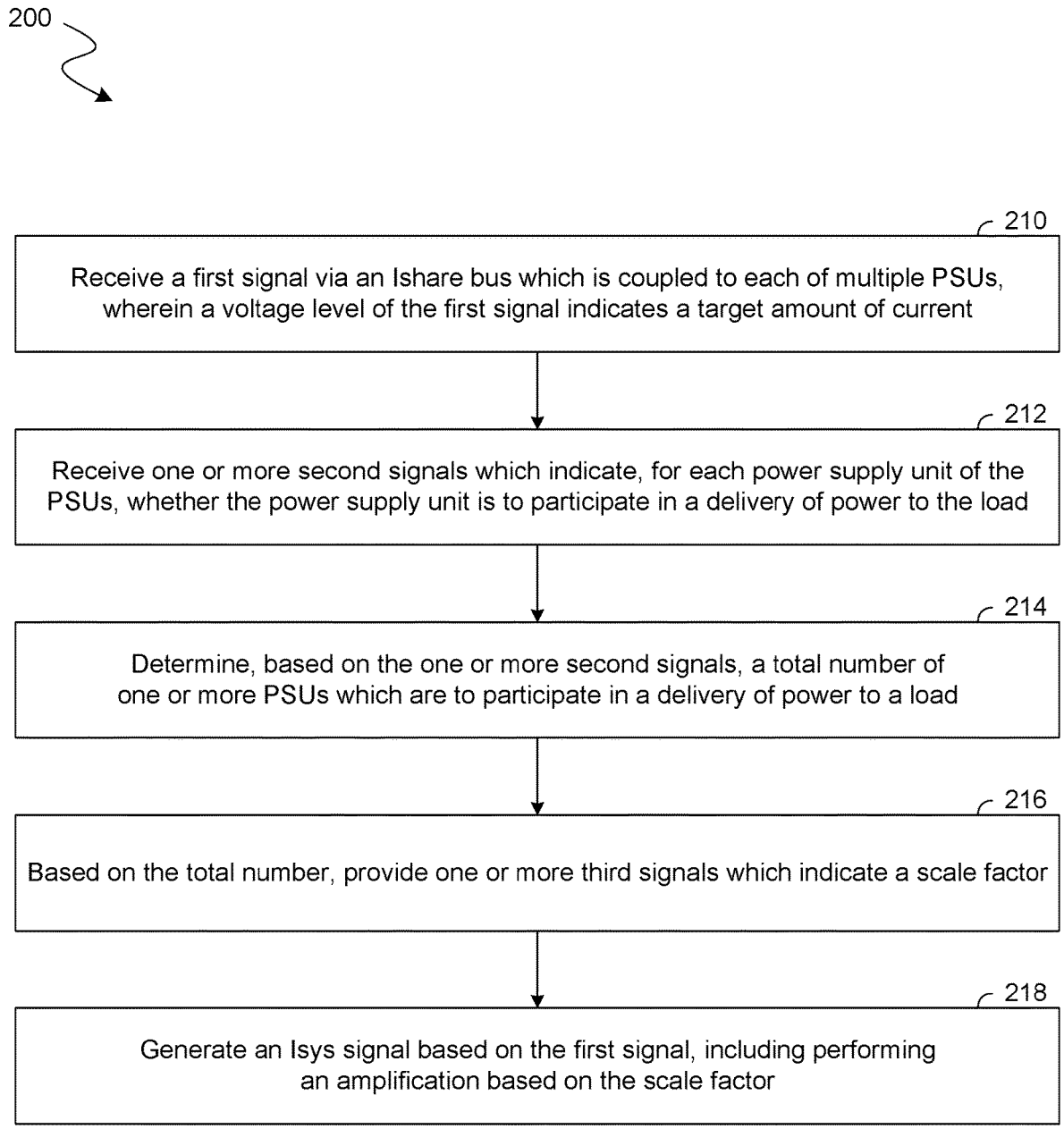
FIG. 2 shows a flow diagram illustrating features of a method to indicate an amount of current to be provided with one or more PSUs according to an embodiment.

FIG. 2 shows features of a method 200 to indicate an amount of current to be provided with one or more PSUs according to an embodiment. Method 200 illustrates one example of an embodiment wherein a signal, received via a current share bus, is used to generate another signal which represents a total load current provided with multiple PSUs. Operations of method 200 are performed with some or all of circuitry 120, for example.

Method 200 is performed at a device which is coupled between a load and multiple PSUs, wherein the device is coupled to each of the multiple PSUs. As shown in FIG. 2, method 200 comprises (at 210) the device receiving a first signal via a bus which is coupled between the device and each of the multiple PSUs. For example, the bus is a current share bus (e.g., an Ishare bus), wherein a voltage level of the first signal indicates a target amount of current to be output by each of one or more PSUs of the multiple PSUs. In an embodiment, the first signal is received at 210 by first circuitry which provides amplifier functionality—e.g., including functionality of scaler circuit 130 and/or amplifier circuitry 150.

Method 200 further comprises (at 212) receiving one or more second signals—e.g., including signal Idps 102—which indicate, for each power supply unit of the multiple PSUs, whether the power supply unit is in a respective compliant state to enable participation in a delivery of power to the load. For example, the one or more second signals are received at 212 by second circuitry which provides functionality of selector 140.

Method 200 further comprises (at 214) determining a total number of the one or more PSUs, wherein the determining is performed with the second circuitry based on the one or more second signals. In one such embodiment, the one or more third signals each comprise a respective bit of a binary value which represents the total number determined at 214.

Based on the total number, method 200 (at 216) further provides one or more third signals—e.g., including signals PSS 104a, . . . , PSS 104n—which indicate a scale factor for a subsequent amplification. Based the first signal, method 200 (at 218) generates a fourth (Isys) signal, wherein the generating comprises performing the amplification—e.g., including a transconductance amplification—based on the scale factor indicated by the one or more third signals. In some embodiments, method 200 comprises a scaler circuit of the first circuitry receiving one or more fifth signals—e.g., including signals PSS 104a, . . . , 104n—which identify a first PSU of the multiple PSUs as being a source of the first signal. Based on the one or more fifth signals, the scaler circuit amplifies the first signal to generate a sixth signal (such as signal 132). Subsequently, a transconductance amplifier circuit of the first circuitry performs the amplification at 218 using the sixth signal.

In one such embodiment, the one or more fifth signals comprise multiple signals which each correspond to a different respective one of the multiple PSUs, the multiple signals each indicating whether the corresponding PSU is a primary PSU of the multiple PSUs. Additionally or alternatively, the one or more fifth signals provides a value which specifies or otherwise indicates a scale according to which the voltage level of the first signal indicates the target amount of current. For example, the value comprises an identifier of a model type of a first PSU (where the model type corresponds to the scale) or, alternatively, the value specifies the scale.

Figure 3:
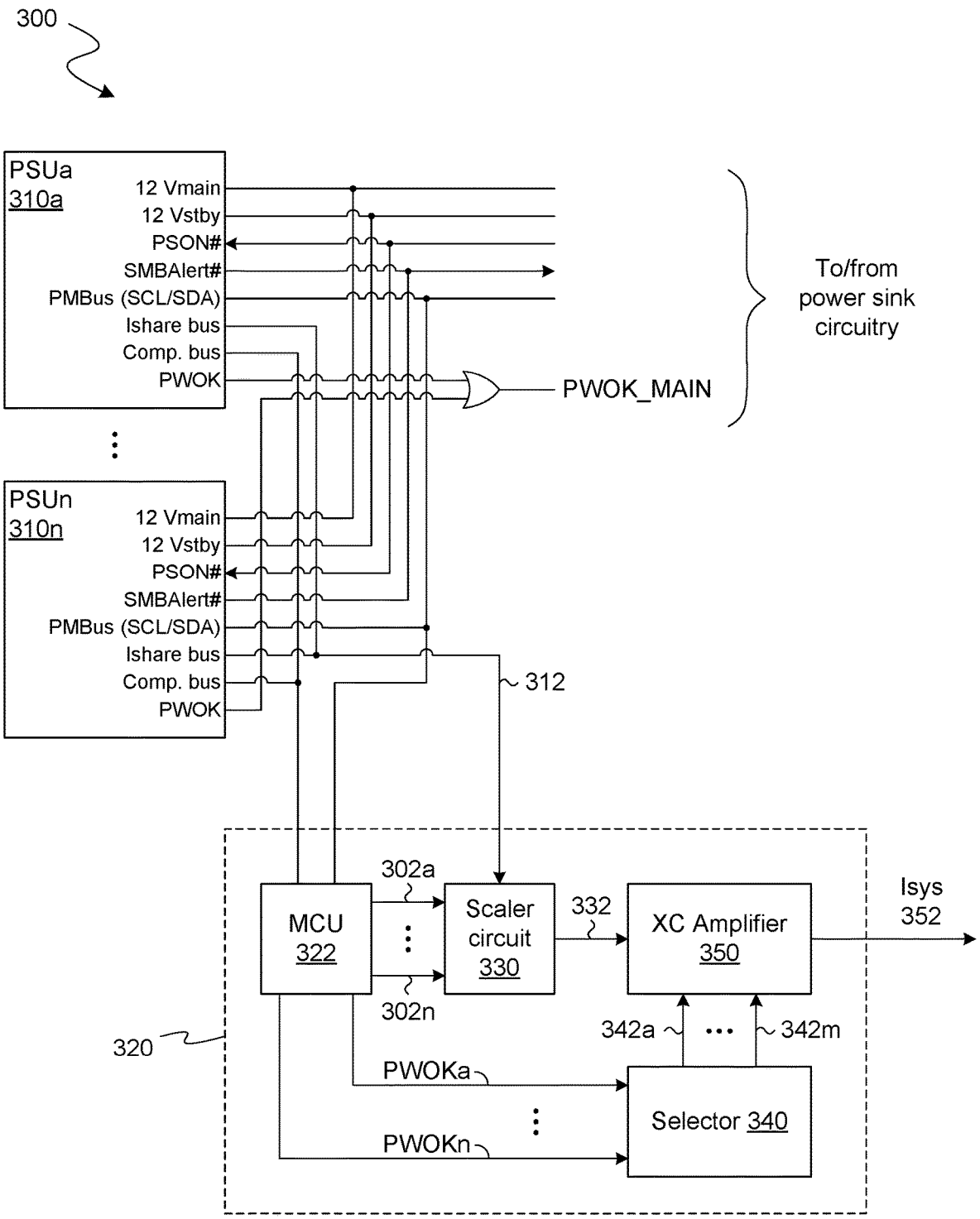
FIG. 3 shows a functional block diagram illustrating features of a system to generate power delivery information according to an embodiment.

FIG. 3 shows features of a system 300 to generate power delivery information according to an embodiment. System 300 provides functionality such as that of system 100, for example—e.g., wherein one or more operations of method 200 are performed with system 300.

As shown in FIG. 3, system 300 comprises power supply units PSUa 310a, . . . , PSUn 310n which are coupled to provide a supply voltage to power sink circuitry (not shown) which is included in—or alternatively, is to couple to—system 300. Power supply units PSUa 310a, . . . , PSUn 310n are coupled to each other via a current share (Ishare) bus which facilitates current sharing functionality. For example, a given PSU—which is designated to operate as a primary PSU of PSUa 310a, . . . , PSUn 310n—uses the Ishare bus to indicate to a target amount of current for any other PSU which is to participate in power delivery to the power sink circuitry.

In one illustrative embodiment, power supply units PSUa 310a, . . . , PSUn 310n each comprise respective terminals to variously provide (for example) a main voltage Vmain, a standby voltage Vstby, a signal PSON# to turn a given PSU on or off, a signal SMBAlert# to facilitate an alert to any of various status events, a power management bus PMBus comprising a serial data (SDA) line and a serial clock (SCL) line, an Ishare bus, a compatibility bus (or "capability bus"), and power ok (PWOK) signal with which a given PSU is to indicate a respective compliant state. In one embodiment, an aggregate power ok signal PWOK_MAIN is generated for all of PSUa 310a, . . . , PSUn 310n. In various embodiments, some or all of PSUa 310a, . . . , PSUn 310n meet the requirements of a Common Redundant Power Supply (CRPS) specification, such as one released by Intel Corporation of Santa Clara, CA. However, some of the terminals shown are merely illustrative, and one or more PSUs have any of various arrangements of more, fewer and/or different terminals, in other embodiments.

In an embodiment, system 300 further comprises circuitry 320 which provides functionality (such as that of circuitry 120) to generate an Isys signal 352 based on a voltage level of a signal 312 which is received via the Ishare bus. By way of illustration and not limitation, circuitry 320 comprises a scaler circuit 330, a selector 340, and a transconductance amplifier 350 which (for example) correspond functionally to scaler circuit 130, selector 140, amplifier circuitry 150.

Based on signal 312, scaler circuit 330 generates a signal 332 which represents a scaled version of the voltage of signal 312. For example, scaler circuit 330 is further coupled to receive signals 302a, . . . , 302n which correspond to PSUa 310a, . . . , PSUn 310n (respectively). Signals 302a, . . . , 302n each provide respective state information for the corresponding PSU—e.g., wherein signal 302a indicates whether PSUa 310a is a primary PSU (and thus, the source of signal 312), and where signal 302a indicates whether PSUa 310a is the primary PSU. Signals 302a, . . . , 302n determine, at least in part, a scale factor according to which scaler circuit 330 generates signal 332 based on signal 312. For example, a voltage of signal 312 is normalized, based on the primary PSU, from an Amps-per-Volt scale used by the primary PSU, to a reference Amps-per-Volt scale in preparation for a later transconductance amplification.

Transconductance amplifier 350 performs a transconductance amplification of signal 332, based on signals 342a, . . . , 342m from selector 340, to generate Isys signal 352. For example, transconductance amplifier 350 further receives, from selector 340, signals 342a, . . . , 342m which provide a multi-bit value representing a total number of one or more compliant PSUs. In various embodiments, selector 340 generates signals 342a, . . . , 342m based on signals PWOKa, . . . , PWOKn that—for example—correspond to PSUa 310a, . . . , PSUn 310n (respectively). In one such embodiment, signals PWOKa, . . . , PWOKn each indicate whether the corresponding PSU is in a respective compliant state (to enable participation in a delivery of power). In an embodiment, signals PWOKa, . . . , PWOKn correspond functionally to signals PSS 104a, . . . , PSS 104n.

In the example embodiment shown, circuitry 320 further includes—or alternatively, is to couple to—a microcontroller unit MCU 322 (or other suitable circuitry) which is configured to generate, relay or otherwise provide signals 302a, . . . , 302n and/or signals PWOKa, . . . , PWOKn based on communications (for example) with some or all of PSUa 310a, . . . , PSUn 310n. For example, MCU 322 is coupled to the PMBus, the compatibility bus and/or other suitable interconnect structures which variously facilitate the detection of operational state for some or all of power supply units PSUa 310a, . . . , PSUn 310n.

Figure 4:
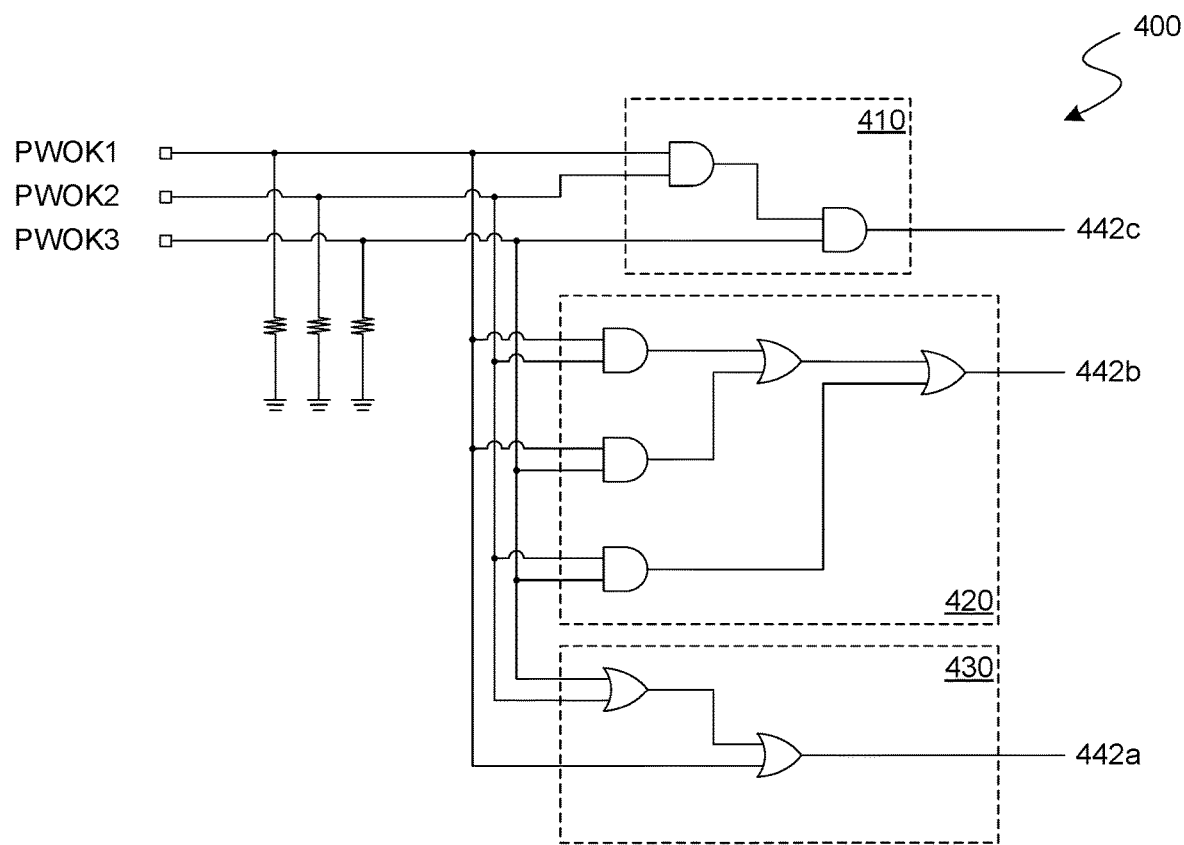
FIG. 4 shows a circuit diagram illustrating features of a selector circuit to facilitate a regulation of power delivery with one or more PSUs according to an embodiment.

FIG. 4 shows features of a selector circuit 400 to facilitate a regulation of power delivery with one or more PSUs according to an embodiment. Selector circuit 400 illustrates one example of a device which determines, at least in part, a scale of transconductance amplification to generate a signal which indicates a system current. In various embodiments, selector circuit 400 provides functionality such as that of selector 140 or selector 340—e.g., wherein one or more operations of method 200 are performed with selector circuit 400.

As shown in FIG. 4, selector circuit 400 accommodates coupling to receive signals which indicate respective compliance state values PWOK1, PWOK2, PWOK3 each for a corresponding one of multiple power supply units. For example, PWOK1, PWOK2, PWOK3 each indicate whether the corresponding PSU is in a respective compliant state (to enable participation in a delivery of power). In an embodiment, the signals indicating values PWOK1, PWOK2, PWOK3 correspond functionally to signals PSS 104a, . . . , PSS 104n.

Based on values PWOK1, PWOK2, PWOK3, selector circuit 400 generates signals 442a, 442b, 442c which each correspond to a different respective bit of a multi-bit value. In an embodiment, the multi-bit value represents a total number of the one or more PSUs which are each in a respective compliant state. In the illustrative embodiment shown, circuitry 430 of selector circuit 400 generates a signal 442a to represent a least significant bit of the value—e.g., wherein circuitry 420 is to generate a signal 442b representing a second least significant bit, and wherein circuitry 410 is to generate a most significant bit of the value.

Figure 5:
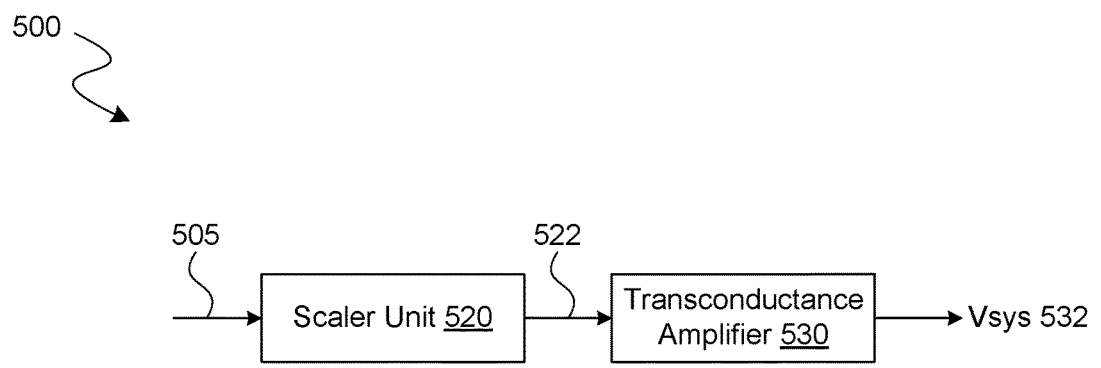
FIG. 5 shows a functional block diagram illustrating features of a circuitry to identify a voltage to be provided with multiple PSUs according to an embodiment.

FIG. 5 shows features of a circuitry 500 to identify a voltage to be provided with multiple PSUs according to an embodiment. Circuitry 500 illustrates one example of an embodiment wherein a device is to communicate power delivery information in addition to a signal which indicates a total load current provided by one or more PSUs. In various embodiments, functionality of circuitry 500 is provided, for example, with system 100 or system 300—e.g., wherein method 200 further comprises (or alternatively, is performed in addition to) one or more operations of circuitry 500.

As shown in FIG. 5, circuitry 500 comprises a scaler unit 520 which accommodates coupling to receive a voltage 505 which is provided with one or more power supply units. For example, voltage 505 is a standby voltage Vstby such as that which is provided with one of the power supply units PSUa 310a, . . . , PSUn 310n. In another embodiment, voltage 505 is (for example) the voltage Vsupply provided with one or more of PSUs 110a, . . . , 110n. Scaler unit 520 generates a signal 522 based on supply voltage 505, wherein a voltage level of signal 522 represents a scaled version—e.g., with a scale factor less than one (1)—of the level of voltage 505. A transconductance amplifier 530 of circuitry 500 is coupled to receive signal 522 from scaler unit 520, and to perform a transconductance amplification, based on signal 522, to generate a Vsys signal 532. By way of illustration, operations of scaler unit 520 and transconductance amplifier 530 provide for Vsys signal 532 having a current which represents the level of voltage 505—e.g., wherein said representing is according to a 100 microAmps per Volt (μA/V) scale. However, some embodiments are not limited to a particular scale according to which Vsys signal 532 represents the level of voltage 505.

Figure 6:
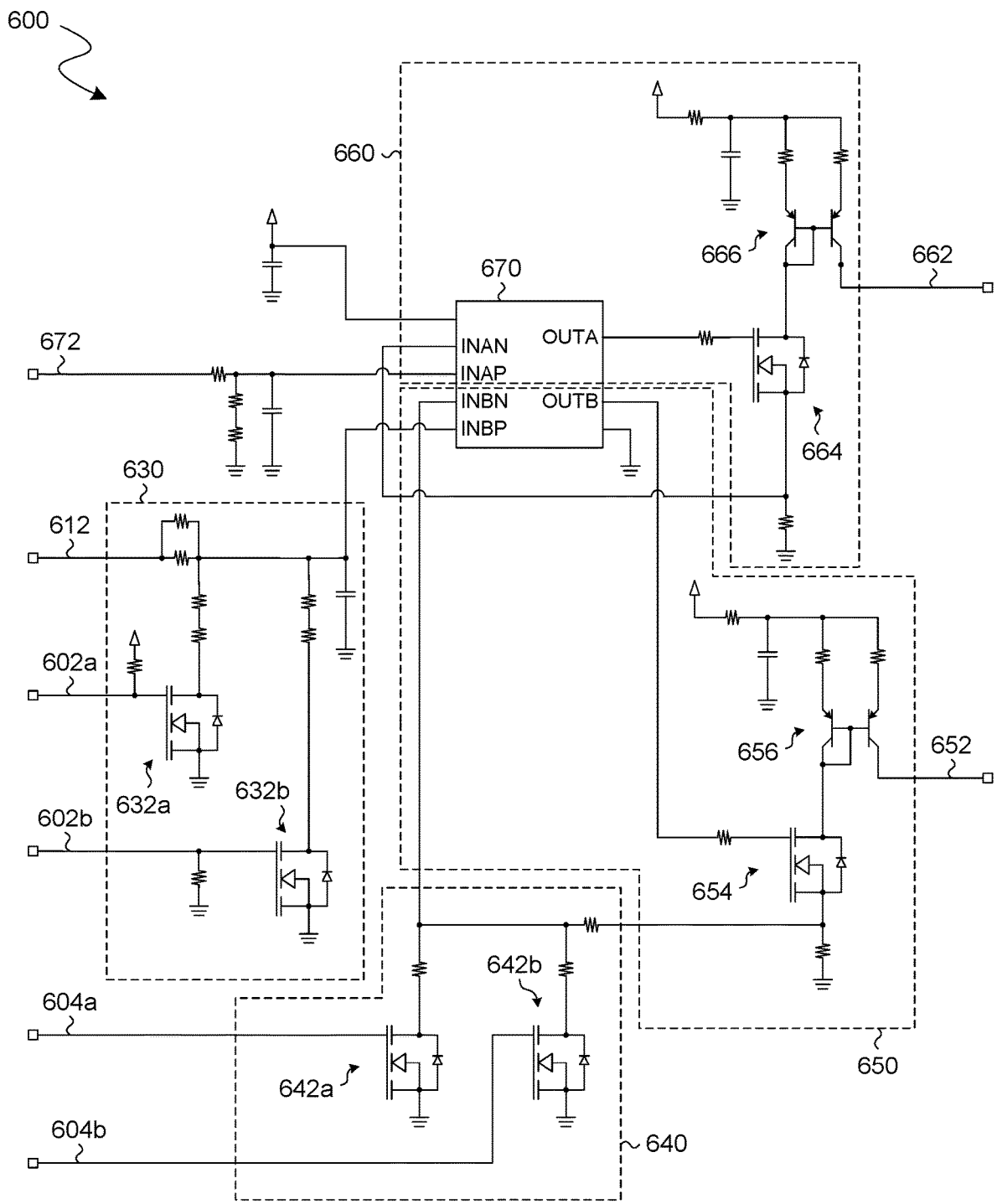
FIG. 6 shows a circuit diagram illustrating features of a device to identify an amount of current to be provided with multiple PSUs according to an embodiment.

FIG. 6 shows features of a device 600 to identify an amount of current to be provided with multiple PSUs according to an embodiment. In various embodiments, device 600 provides functionality such as that of system 100, or system 300—e.g., wherein one or more operations of method 200 are performed with device 600.

As shown in FIG. 6, device 600 comprises circuitry to generate a Isys signal 652 based on a signal which is communicated via a current share bus. In one such embodiment, device 600 comprises scaler circuit 630, selector 640, and Isys generation circuitry 650 which, for example, correspond functionally to scaler circuit 130, selector 140, and amplifier circuitry 150 (respectively). Although some embodiments are not limited in this regard, device 600 additionally or alternatively comprises Vsys generation circuitry 660 which provides functionality, such as that of circuitry 500, to generate a Vsys signal 662.

In various embodiments, scaler circuit 630 is coupled to receive a signal 612 which is communicated via a current share bus—e.g., current share bus 112—that is coupled between multiple (in this example, two) PSUs. Scaler circuit 630 is further coupled to receive signals 602a, 602b which variously provide functionality such as that of signal Idps 102. For example, a voltage level of signal 602a represents a logic state to indicate whether a corresponding first PSU is currently designated as a primary PSU—e.g., wherein a voltage level of signal 602b similarly represents a logic state to indicate whether a corresponding second PSU is currently designated as the primary PSU.

An IC chip 670 of device 600 comprises a first differential amplifier which has two input terminals (INBP, INBN) and one output terminal (OUTB), wherein INBP is coupled to receive an output from scaler circuit 630. For example, a transistor 632a of scaler circuit 630 is coupled to be selectively activated based on signal 602a—e.g., wherein a flow of current through transistor 632a (and through one or more resistors variously coupled thereto) results in a voltage, at terminal INBP, which represents a scaled version of the voltage level of signal 612. Similarly, a transistor 632b is coupled to be selectively activated based on signal 602b—e.g., wherein current flow through transistor 632b results in a voltage at terminal INBP which represents a differently scaled version of the voltage level of signal 612.

In some embodiments, selector 640 is coupled to receive signals 604a, 604b which variously provide functionality such as that of signals PSS 104a, . . . , PSS 104n. For example, a voltage level of signal 604a represents a logic state to indicate whether the corresponding first PSU is in a compliant state to participate in power delivery to a load circuit—e.g., wherein a voltage level of signal 604b similarly represents a logic state to indicate whether the corresponding second PSU is similarly compliant.

In one such embodiment, the terminal INBN of IC chip 670 is coupled to receive an output from selector 640. For example, a transistor 642a of selector 640 is coupled to be selectively activated based on signal 604a, wherein a transistor 642b is similarly coupled to be selectively activated based on signal 604b. A current through transistor 642a and/or a current through transistor 642b (and through one or more resistors variously coupled thereto) results in a voltage, at terminal INBN, which determines at least in part an amplification—with the first differential amplifier of IC chip 670—that corresponds to the total number of the one or more "compliant" PSUs which are to participate in power delivery.

In an embodiment, Isys generation circuitry 650 is coupled to terminal OUTB of the first differential amplifier of IC chip 670. The Isys signal 652 is output from a transconductance amplifier of Isys generation circuitry 650—e.g., wherein the transconductance amplifier comprises an arrangement of back-to-back transistors 656. For example, a flow of current through back-to-back transistors 656 is regulated by a transistor 654 which operates based on the level of voltage at terminal OUTB.

In the example embodiment shown, IC chip 670 further comprises a second differential amplifier which has two input terminals (INAP, INAN) and one output terminal (OUTA), wherein INAP is coupled to receive a standby voltage 672. The terminal OUTA outputs a voltage level which represents a scaled version of the standby voltage 672—e.g., wherein terminal INAN receives a feedback signal to facilitate such scaling. In one such embodiment, a Vsys signal 662 (e.g., Vsys signal 532) is output from a transconductance amplifier of Vsys generation circuitry 660—e.g., wherein the transconductance amplifier comprises an arrangement of back-to-back transistors 666. For example, a flow of current through back-to-back transistors 666 is regulated by a transistor 664 which operates based on the level of voltage at terminal OUTA.

Figure 7:
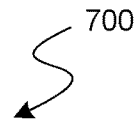
FIG. 7 shows a table illustrating various scenarios each wherein respective power delivery information is determined according to a corresponding embodiment.

FIG. 7 shows features of a table 700 illustrating various scenarios, each wherein respective power delivery information is determined according to a corresponding embodiment. A given one of the scenarios represented in table 700 is provided, for example, with one of system 100, or system 300—e.g., according to method 200.

As shown in FIG. 7, table 700 shows various parameters, values and/or other information for six different example scenarios wherein respective Isys signals are generated. In each such scenario, three power supply units PS1, PS2, PS3 are coupled to each other via an Ishare bus, wherein a particular one or more of PS1, PS2, PS3 are each in a respective compliant state to participate in a delivery of power to the same one or more load circuits. Such power delivery is performed with current sharing functionality of PS1, PS2, and PS3—e.g., wherein each of the one or more participating PSUs is to output the same load current in support of said power delivery. One such participating PSU is designated as a primary PSU of the one or more PSUs, wherein a target the amount of the per-PSU load current is indicated by the primary PSU (via an Ishare bus) to each of any others of the one or more participating PSUs.

For each of the illustrated scenarios, table 700 shows an indicator Idps 702 of a PSU which—in that particular scenario—has been designated to be the primary PSU of the one or more PSUs which are to participate in a delivery of power. For example, indicator Idps 702 is communicated via signal Idps 102, in some embodiments. Furthermore, table 700 shows a voltage level Vld 712 of a signal received via an Ishare bus, as well as a voltage level Vsc 732 of another signal which represents a scaled version of voltage level Vld 712. For example, voltage levels Vld 712, Vsc 732 are the respective levels of the current share bus signal 112, and signal 132, in some embodiments.

Further still, table 700 shows compliance state values PWOK1 704a, PWOK2 704b, PWOK3 704c for PS1, PS2, and PS3 (respectively)—e.g., wherein values PWOK1 704a, PWOK2 704b, PWOK3 704c are communicated with signals PSS 104a, . . . , PSS 104n. Table 700 also shows a signal Isys 752 (such as Isys signal 152), and a XC scale factor to be applied with a transconductance amplifier to generate Isys 752. In one example embodiment, the XC scale factor is the factor f2 provided with amplifier circuitry 150.

In the illustrative scenarios shown, preparation for transconductance amplification includes scaling Vld 712 to a reference scale of 15.0 A/V (which happens to be the same scale used by PS2). For example, to represent an amount of current with voltage level Vld 712, PS1 uses a 20.0 Amps/Volt (A/V) scale—i.e., when PS1 is the primary PSU. By contrast, PS2 uses a 15.0 Amps/Volt (A/V) scale to represent an amount of current with voltage level Vld 712—e.g., wherein PS3 instead uses a 12.0 Amps/Volt (A/V) scale.

A scale factor f1 (to generate voltage level Vsc 732 based on voltage level Vld 712) is to have different values at different times—e.g., depending on which one of PS1, PS2, PS3, at a given time, is currently designated a primary PSU. By way of illustration and not limitation, where PS1 is the primary PSU, scale factor f1 is to be 1.333 (i.e., a ratio of the respective scales used by PS1 and PS2). Alternatively, where PS3 is the primary PSU, scale factor f1 is to be 0.8 (i.e., a ratio of the respective scales used by PS3 and PS2). Where PS2 is the primary PSU, scale factor f1 is to be 1.0 (e.g., where no voltage scaling of the Vld is needed before transconductance amplification is performed).

In various embodiments, the values PWOK1 704a, PWOK2 704b, PWOK3 704c, determine a transconductance (XC) scale factor for generating Isys 752 based on Vsc 732. In the example scenarios shown, the various XC scale factors are each a respective integer multiple of a baseline scale factor—e.g., the illustrative baseline 150 microAmps per Volt (μA/V) shown. For example, the integer multiple is equal to a total number—as indicated by the values PWOK1 704a, PWOK2 704b, PWOK3 704c—of the one or more compliant PSUs which are to participate in a delivery of power to a load circuit.

By way of illustration and not limitation, in scenarios 1, and 3 (where only one PSU is to participate in power delivery) the transconductance scale factor is to be 150 μA/V. By contrast, in scenarios 2, 4 and 5 (where exactly two PSUs are to participate in power delivery) the transconductance scale factor is to be 300 μA/V—i.e., double the 150 μA/V scale factor. Alternatively, in scenario 6 (where each of PS1, PS2, and PS3 is to participate in power delivery) the transconductance scale factor is to be 450 μA/V—i.e., triple the 150 μA/V scale factor.

In the example scenarios shown by table 700, Isys 752 represents an amount of current provided by the one or more compliant PSUs which are each to participate in power delivery, wherein the representation is on a 10 μA/A scale (for example). Some embodiments variously change the amount of current of signal Isys 752 over time—e.g., by changing the value of scale factor f1 based on a change to voltage level Vld 712 and/or a change to the PSU indicated by Idps 702. Additionally or alternatively, changing the amount of current of signal Isys 752 includes changing the XC scale factor—e.g., based on a change to the total number of compliant/participating PSUs (as indicated by the compliance state values PWOK1 704a, PWOK2 704b, PWOK3 704c).

Figure 8:
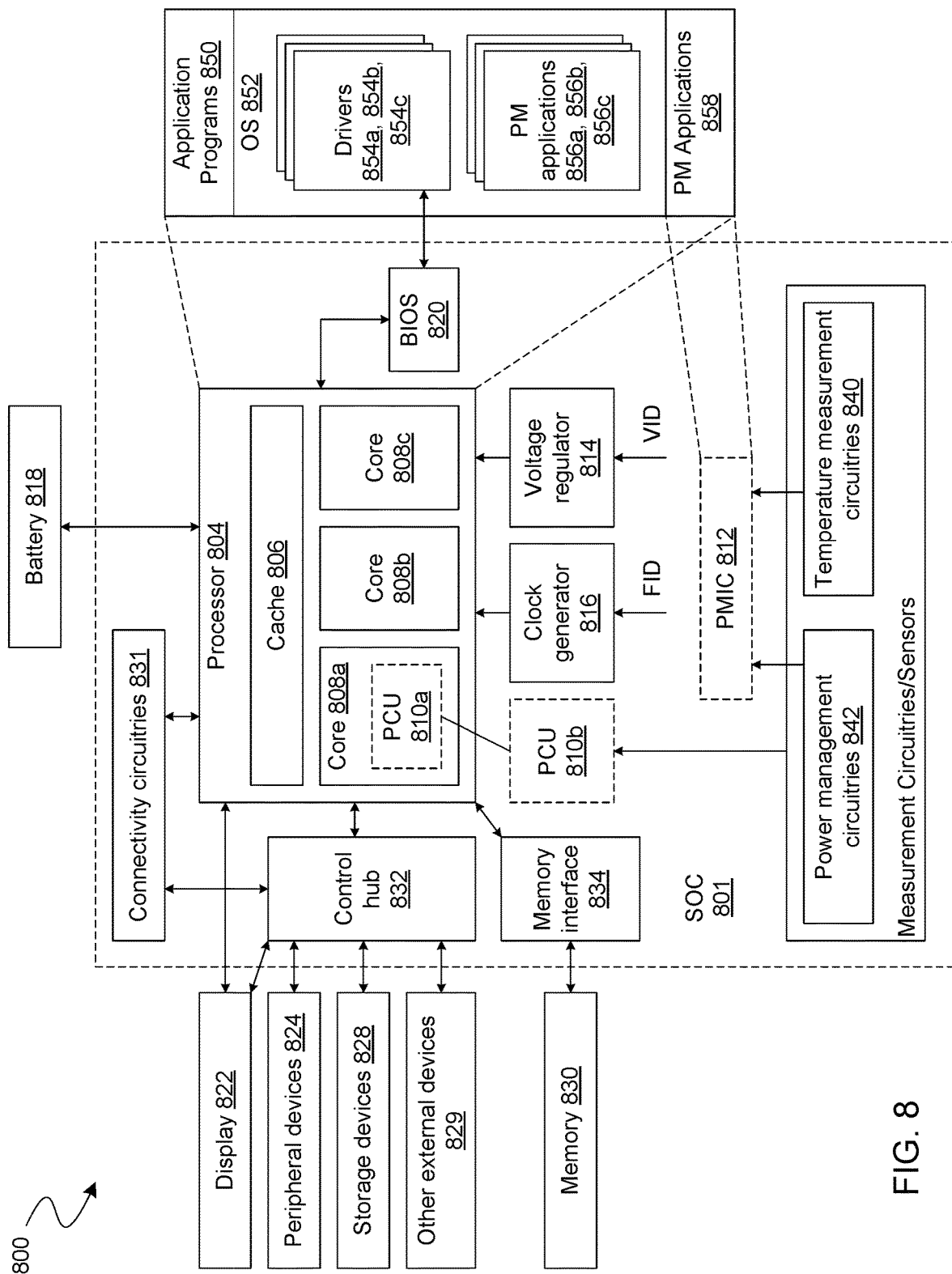
FIG. 8 shows a functional block diagram illustrating features of a computer device to facilitate a regulation of power delivery with multiple PSUs according to an embodiment.

FIG. 8 illustrates a computer system or computing device 800 (also referred to as device 800), where power delivery information is provided, in accordance with some embodiments. It is pointed out that those elements of FIG. 8 having the same reference numbers (or names) as the elements of any other figure can operate or function in any manner similar to that described, but are not limited to such.

In some embodiments, device 800 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 800.

In an example, the device 800 comprises a SoC (System-on-Chip) 801. An example boundary of the SOC 801 is illustrated using dotted lines in FIG. 8, with some example components being illustrated to be included within SOC 801—however, SOC 801 may include any appropriate components of device 800.

In some embodiments, device 800 includes processor 804. Processor 804 can include one or more physical devices, such as microprocessors, application processors, microcontrollers, programmable logic devices, processing cores, or other processing means. The processing operations performed by processor 804 include the execution of an operating platform or operating system on which applications and/or device functions are executed. The processing operations include operations related to I/O (input/output) with a human user or with other devices, operations related to power management, operations related to connecting computing device 800 to another device, and/or the like. The processing operations may also include operations related to audio I/O and/or display I/O.

In some embodiments, processor 804 includes multiple processing cores (also referred to as cores) 808a, 808b, 808c. Although merely three cores 808a, 808b, 808c are illustrated in FIG. 8, the processor 804 may include any other appropriate number of processing cores, e.g., tens, or even hundreds of processing cores. Processor cores 808a, 808b, 808c may be implemented on a single integrated circuit (IC) chip. Moreover, the chip may include one or more shared and/or private caches, buses or interconnections, graphics and/or memory controllers, or other components.

In some embodiments, processor 804 includes cache 806. In an example, sections of cache 806 may be dedicated to individual cores 808 (e.g., a first section of cache 806 dedicated to core 808a, a second section of cache 806 dedicated to core 808b, and so on). In an example, one or more sections of cache 806 may be shared among two or more of cores 808. Cache 806 may be split in different levels, e.g., level 1 (L1) cache, level 2 (L2) cache, level 3 (L3) cache, etc.

In some embodiments, a given processor core (e.g., core 808a) may include a fetch unit to fetch instructions (including instructions with conditional branches) for execution by the core 808a. The instructions may be fetched from any storage devices such as the memory 830. Processor core 808a may also include a decode unit to decode the fetched instruction. For example, the decode unit may decode the fetched instruction into a plurality of micro-operations. Processor core 808a may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, an execution unit may execute instructions out-of-order. Hence, processor core 808a (for example) may be an out-of-order processor core in one embodiment. Processor core 808a may also include a retirement unit. The retirement unit may retire executed instructions after they are committed. In an embodiment, retirement of the executed instructions may result in processor state being committed from the execution of the instructions, physical registers used by the instructions being de-allocated, etc. The processor core 808a may also include a bus unit to enable communication between components of the processor core 808a and other components via one or more buses. Processor core 808a may also include one or more registers to store data accessed by various components of the core 808a (such as values related to assigned app priorities and/or sub-system states (modes) association.

In some embodiments, device 800 comprises connectivity circuitries 831. For example, connectivity circuitries 831 includes hardware devices (e.g., wireless and/or wired connectors and communication hardware) and/or software components (e.g., drivers, protocol stacks), e.g., to enable device 800 to communicate with external devices. Device 800 may be separate from the external devices, such as other computing devices, wireless access points or base stations, etc.

In an example, connectivity circuitries 831 may include multiple different types of connectivity. To generalize, the connectivity circuitries 831 may include cellular connectivity circuitries, wireless connectivity circuitries, etc. Cellular connectivity circuitries of connectivity circuitries 831 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 831 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 831 may include a network interface, such as a wired or wireless interface, e.g., so that a system embodiment may be incorporated into a wireless device, for example, cell phone or personal digital assistant.

In some embodiments, device 800 comprises control hub 832, which represents hardware devices and/or software components related to interaction with one or more I/O devices. For example, processor 804 may communicate with one or more of display 822, one or more peripheral devices 824, storage devices 828, one or more other external devices 829, etc., via control hub 832. Control hub 832 may be a chipset, a Platform Control Hub (PCH), and/or the like.

For example, control hub 832 illustrates one or more connection points for additional devices that connect to device 800, e.g., through which a user might interact with the system. For example, devices (e.g., devices 829) that can be attached to device 800 include microphone devices, speaker or stereo systems, audio devices, video systems or other display devices, keyboard or keypad devices, or other I/O devices for use with specific applications such as card readers or other devices.

As mentioned above, control hub 832 can interact with audio devices, display 822, etc. For example, input through a microphone or other audio device can provide input or commands for one or more applications or functions of device 800. Additionally, audio output can be provided instead of, or in addition to display output. In another example, if display 822 includes a touch screen, display 822 also acts as an input device, which can be at least partially managed by control hub 832. There can also be additional buttons or switches on computing device 800 to provide I/O functions managed by control hub 832. In one embodiment, control hub 832 manages devices such as accelerometers, cameras, light sensors or other environmental sensors, or other hardware that can be included in device 800. The input can be part of direct user interaction, as well as providing environmental input to the system to influence its operations (such as filtering for noise, adjusting displays for brightness detection, applying a flash for a camera, or other features).

In some embodiments, control hub 832 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 822 represents hardware (e.g., display devices) and software (e.g., drivers) components that provide a visual and/or tactile display for a user to interact with device 800. Display 822 may include a display interface, a display screen, and/or hardware device used to provide a display to a user. In some embodiments, display 822 includes a touch screen (or touch pad) device that provides both output and input to a user. In an example, display 822 may communicate directly with the processor 804. Display 822 can be one or more of an internal display device, as in a mobile electronic device or a laptop device or an external display device attached via a display interface (e.g., DisplayPort, etc.). In one embodiment display 822 can be a head mounted display (HMD) such as a stereoscopic display device for use in virtual reality (VR) applications or augmented reality (AR) applications.

In some embodiments and although not illustrated in the figure, in addition to (or instead of) processor 804, device 800 may include Graphics Processing Unit (GPU) comprising one or more graphics processing cores, which may control one or more aspects of displaying contents on display 822.

Control hub 832 (or platform controller hub) may include hardware interfaces and connectors, as well as software components (e.g., drivers, protocol stacks) to make peripheral connections, e.g., to peripheral devices 824.

It will be understood that device 800 could both be a peripheral device to other computing devices, as well as have peripheral devices connected to it. Device 800 may have a "docking" connector to connect to other computing devices for purposes such as managing (e.g., downloading and/or uploading, changing, synchronizing) content on device 800. Additionally, a docking connector can allow device 800 to connect to certain peripherals that allow computing device 800 to control content output, for example, to audiovisual or other systems.

In addition to a proprietary docking connector or other proprietary connection hardware, device 800 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 831 may be coupled to control hub 832, e.g., in addition to, or instead of, being coupled directly to the processor 804. In some embodiments, display 822 may be coupled to control hub 832, e.g., in addition to, or instead of, being coupled directly to processor 804.

In some embodiments, device 800 comprises memory 830 coupled to processor 804 via memory interface 834. Memory 830 includes memory devices for storing information in device 800. Memory can include nonvolatile (state does not change if power to the memory device is interrupted) and/or volatile (state is indeterminate if power to the memory device is interrupted) memory devices. Memory device 830 can be a dynamic random access memory (DRAM) device, a static random access memory (SRAM) device, flash memory device, phase-change memory device, or some other memory device having suitable performance to serve as process memory. In one embodiment, memory 830 can operate as system memory for device 800, to store data and instructions for use when the one or more processors 804 executes an application or process. Memory 830 can store application data, user data, music, photos, documents, or other data, as well as system data (whether long-term or temporary) related to the execution of the applications and functions of device 800.

Elements of various embodiments and examples are also provided as a machine-readable medium (e.g., memory 830) for storing the computer-executable instructions (e.g., instructions to implement any other processes discussed herein). The machine-readable medium (e.g., memory 830) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 800 comprises temperature measurement circuitries 840, e.g., for measuring temperature of various components of device 800. In an example, temperature measurement circuitries 840 may be embedded, or coupled or attached to various components, whose temperature are to be measured and monitored. For example, temperature measurement circuitries 840 may measure temperature of (or within) one or more of cores 808a, 808b, 808c, voltage regulator 814, memory 830, a mother-board of SOC 801, and/or any appropriate component of device 800.

In some embodiments, device 800 comprises power measurement circuitries 842, e.g., for measuring power consumed by one or more components of the device 800. In an example, in addition to, or instead of, measuring power, the power measurement circuitries 842 may measure voltage and/or current. In an example, the power measurement circuitries 842 may be embedded, or coupled or attached to various components, whose power, voltage, and/or current consumption are to be measured and monitored. For example, power measurement circuitries 842 may measure power, current and/or voltage supplied by one or more voltage regulators 814, power supplied to SOC 801, power supplied to device 800, power consumed by processor 804 (or any other component) of device 800, etc.

In some embodiments, device 800 comprises one or more voltage regulator circuitries, generally referred to as voltage regulator (VR) 814. VR 814 generates signals at appropriate voltage levels, which may be supplied to operate any appropriate components of the device 800. Merely as an example, VR 814 is illustrated to be supplying signals to processor 804 of device 800. In some embodiments, VR 814 receives one or more Voltage Identification (VID) signals, and generates the voltage signal at an appropriate level, based on the VID signals. Various type of VRs may be utilized for the VR 814. For example, VR 814 may include a "buck" VR, "boost" VR, a combination of buck and boost VRs, low dropout (LDO) regulators, switching DC-DC regulators, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR which is controlled by PCU 810*a/b* and/or PMIC 812. In some embodiments, each core has a network of distributed LDOs to provide efficient control for power management. The LDOs can be digital, analog, or a combination of digital or analog LDOs.

In some embodiments, device 800 comprises one or more clock generator circuitries, generally referred to as clock generator 816. Clock generator 816 generates clock signals at appropriate frequency levels, which may be supplied to any appropriate components of the device 800. Merely as an example, clock generator 816 is illustrated to be supplying clock signals to processor 804 of device 800. In some embodiments, clock generator 816 receives one or more Frequency Identification (FID) signals, and generates the clock signals at an appropriate frequency, based on the FID signals.

In some embodiments, device 800 comprises battery 818 supplying power to various components of device 800. Merely as an example, battery 818 is illustrated to be supplying power to processor 804. Although not illustrated in the figures, device 800 may comprise a charging circuitry, e.g., to recharge the battery, based on Alternating Current (AC) power supply received from an AC adapter.

In some embodiments, device 800 comprises Power Control Unit (PCU) 810 (also referred to as Power Management Unit (PMU), Power Controller, etc.). In an example, some sections of PCU 810 may be implemented by one or more processing cores 808, and these sections of PCU 810 are symbolically illustrated using a dotted box and labeled PCU 810*a*. In an example, some other sections of PCU 810 may be implemented outside the processing cores 808, and these sections of PCU 810 are symbolically illustrated using a dotted box and labeled as PCU 810*b*. PCU 810 may implement various power management operations for device 800. PCU 810 may include hardware interfaces, hardware circuitries, connectors, registers, etc., as well as software components (e.g., drivers, protocol stacks), to implement various power management operations for device 800.

In some embodiments, device 800 comprises Power Management Integrated Circuit (PMIC) 812, e.g., to implement various power management operations for device 800. In some embodiments, PMIC 812 is a Reconfigurable Power Management ICs (RPMICs) and/or an IMVP (Intel® Mobile Voltage Positioning). In an example, the PMIC is within an IC chip separate from processor 804. The may implement various power management operations for device 800. PMIC 812 may include hardware interfaces, hardware circuitries, connectors, registers, etc., as well as software components (e.g., drivers, protocol stacks), to implement various power management operations for device 800.

In an example, device 800 comprises one or both PCU 810 or PMIC 812. In an example, any one of PCU 810 or PMIC 812 may be absent in device 800, and hence, these components are illustrated using dotted lines.

Various power management operations of device 800 may be performed by PCU 810, by PMIC 812, or by a combination of PCU 810 and PMIC 812. For example, PCU 810 and/or PMIC 812 may select a power state (e.g., P-state) for various components of device 800. For example, PCU 810 and/or PMIC 812 may select a power state (e.g., in accordance with the ACPI (Advanced Configuration and Power Interface) specification) for various components of device 800. Merely as an example, PCU 810 and/or PMIC 812 may cause various components of the device 800 to transition to a sleep state, to an active state, to an appropriate C state (e.g., C0 state, or another appropriate C state, in accordance with the ACPI specification), etc. In an example, PCU 810 and/or PMIC 812 may control a voltage output by VR 814 and/or a frequency of a clock signal output by the clock generator, e.g., by outputting the VID signal and/or the FID signal, respectively. In an example, PCU 810 and/or PMIC 812 may control battery power usage, charging of battery 818, and features related to power saving operation.

The clock generator 816 can comprise a phase locked loop (PLL), frequency locked loop (FLL), or any suitable clock source. In some embodiments, each core of processor 804 has its own clock source. As such, each core can operate at a frequency independent of the frequency of operation of the other core. In some embodiments, PCU 810 and/or PMIC 812 performs adaptive or dynamic frequency scaling or adjustment. For example, clock frequency of a processor core can be increased if the core is not operating at its maximum power consumption threshold or limit. In some embodiments, PCU 810 and/or PMIC 812 determines the operating condition of each core of a processor, and opportunistically adjusts frequency and/or power supply voltage of that core without the core clocking source (e.g., PLL of that core) losing lock when the PCU 810 and/or PMIC 812 determines that the core is operating below a target performance level. For example, if a core is drawing current from a power supply rail less than a total current allocated for that core or processor 804, then PCU 810 and/or PMIC 812 can temporarily increase the power draw for that core or processor 804 (e.g., by increasing clock frequency and/or power supply voltage level) so that the core or processor 804 can perform at a higher performance level. As such, voltage and/or frequency can be increased temporality for processor 804 without violating product reliability.

In an example, PCU 810 and/or PMIC 812 may perform power management operations, e.g., based at least in part on receiving measurements from power measurement circuitries 842, temperature measurement circuitries 840, charge level of battery 818, and/or any other appropriate information that may be used for power management. To that end, PMIC 812 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 810 and/or PMIC 812 in at least one embodiment to allow PCU 810 and/or PMIC 812 to manage processor core energy at least in part based on value(s) detected by one or more of the sensors.

Also illustrated is an example software stack of device 800 (although not all elements of the software stack are illustrated). Merely as an example, processors 804 may execute application programs 850, Operating System 852, one or more Power Management (PM) specific application programs (e.g., generically referred to as PM applications 858), and/or the like. PM applications 858 may also be executed by the PCU 810 and/or PMIC 812. OS 852 may also include one or more PM applications 856a, 856b, 856c. The OS 852 may also include various drivers 854a, 854b, 854c, etc., some of which may be specific for power management purposes. In some embodiments, device 800 may further comprise a Basic Input/Output System (BIOS) 820. BIOS 820 may communicate with OS 852 (e.g., via one or more drivers 854), communicate with processors 804, etc.

For example, one or more of PM applications 858, 856, drivers 854, BIOS 820, etc. may be used to implement power management specific tasks, e.g., to control voltage and/or frequency of various components of device 800, to control wake-up state, sleep state, and/or any other appropriate power state of various components of device 800, control battery power usage, charging of the battery 818, features related to power saving operation, etc.

In various embodiments, device 800 includes, or accommodates coupling to, multiple power supply units (not shown) which are to be coupled to one another via a current share bus. Power measurement circuitries 842 (and/or other suitable circuitry of device 800) provides functionality—such as that of circuitry 120, circuitry 320, or device 600—to generate an Isys signal based on a signal which is received via the current share bus. In one such embodiment, the Isys signal is provided to VR 814 (or other suitable voltage regulation circuitry) to facilitate a regulation of power delivery to one or more load circuits of device 800.

In one or more first embodiments, a device comprises first circuitry to couple to each of multiple power supply units (PSUs) via a bus, and to receive a first signal from the bus, wherein a first voltage level of the first signal is to indicate a target amount of current to be output by each of one or more PSUs of the multiple PSUs, and second circuitry coupled to the first circuitry, the second circuitry to receive one or more second signals which are to indicate, for each power supply unit of the multiple PSUs, whether the power supply unit is to participate in a delivery of power to a load, determine, based on the one or more second signals, a total number of the one or more PSUs, and provide to the first circuitry one or more third signals which indicate a scale factor based on the total number, wherein the first circuitry is further to generate a fourth signal based on the first signal, comprising the first circuitry to perform an amplification based on the scale factor.

In one or more second embodiments, further to the first embodiment, the first circuitry to perform the amplification based on the scale factor comprises the first circuitry to perform a transconductance amplification.

In one or more third embodiments, further to the first embodiment or the second embodiment, the first circuitry comprises a scaler circuit to receive one or more fifth signals which are to identify a first power supply unit (PSU) of the multiple PSUs as a source of the first signal, and amplify the first signal, based on the one or more fifth signals, to generate a sixth signal, and a transconductance amplifier circuit, coupled to the scaler circuit, to perform the transconductance amplification with the sixth signal.

In one or more fourth embodiments, further to the third embodiment, the one or more fifth signals comprise multiple signals which each correspond to a different respective one of the multiple PSUs, the multiple signals each to indicate whether the corresponding PSU is a primary PSU of the multiple PSUs.

In one or more fifth embodiments, further to the third embodiment, the one or more fifth signals comprise a single signal comprising a value which indicates a scale according to which the first voltage level is to indicate the target amount of current.

In one or more sixth embodiments, further to the fifth embodiment, the value comprises an identifier of a model type of a first PSU.

In one or more seventh embodiments, further to the fifth embodiment, the value specifies the scale.

In one or more eighth embodiments, further to the third embodiment, the scaler circuitry is first scaler circuitry, wherein the transconductance amplifier circuit is a first transconductance amplifier circuit, the device further comprising second scaler circuitry to receive a supply voltage which is provided with the one or more power supply units, and generate a seventh signal based on the supply voltage, wherein a second voltage level of the seventh signal represents a scaled version of a third voltage level of the supply voltage, and a second transconductance amplifier circuit coupled the second scaler circuitry, the second transconductance amplifier circuit to generate an eighth signal based on the seventh signal.

In one or more ninth embodiments, further to the eighth embodiment, the first circuitry is to provide the fourth signal to a voltage regulator, and the second transconductance amplifier circuit is to provide the eighth signal to the voltage regulator.

In one or more tenth embodiments, further to the first embodiment or the second embodiment, the one or more third signals each comprise a respective bit of a binary value which represents the total number.

In one or more eleventh embodiments, further to the first embodiment or the second embodiment, the device further comprises scaler circuitry to receive a supply voltage which is provided with the one or more power supply units, and generate a fifth signal based on the supply voltage, wherein a second voltage level of the fifth signal represents a scaled version of a third voltage level of the supply voltage, and a transconductance amplifier circuit coupled the scaler circuitry, the transconductance amplifier circuit to generate a sixth signal based on the fifth signal.

In one or more twelfth embodiments, further to the eleventh embodiment, the first circuitry is to provide the fourth signal to a voltage regulator, and the transconductance amplifier circuit is to provide the sixth signal to the voltage regulator.

In one or more thirteenth embodiments, a system comprises multiple power supply units (PSUs) coupled to each other via a bus, first circuitry coupled to each of the multiple PSUs via the bus, the first circuitry to receive a first signal from the bus, wherein a first voltage level of the first signal is to indicate a target amount of current to be output by each of one or more PSUs of the multiple PSUs, and second circuitry coupled to the first circuitry, the second circuitry to receive one or more second signals which are to indicate, for each power supply unit of the multiple PSUs, whether the power supply unit is to participate in a delivery of power to a load, determine, based on the one or more second signals, a total number of the one or more PSUs, and provide to the first circuitry one or more third signals which indicate a scale factor based on the total number, wherein the first circuitry is further to generate a fourth signal based on the first signal, comprising the first circuitry to perform an amplification based on the scale factor, and a display device coupled to the multiple PSUs, the display device to display an image based on a signal communicated with the load.

In one or more fourteenth embodiments, further to the thirteenth embodiment, the first circuitry to perform the amplification based on the scale factor comprises the first circuitry to perform a transconductance amplification.

In one or more fifteenth embodiments, further to the thirteenth embodiment, the first circuitry comprises a scaler circuit to receive one or more fifth signals which are to identify a first power supply unit (PSU) of the multiple PSUs as a source of the first signal, and amplify the first signal, based on the one or more fifth signals, to generate a sixth signal, and a transconductance amplifier circuit, coupled to the scaler circuit, to perform the transconductance amplification with the sixth signal.

In one or more sixteenth embodiments, further to the fifteenth embodiment, the one or more fifth signals comprise multiple signals which each correspond to a different respective one of the multiple PSUs, the multiple signals each to indicate whether the corresponding PSU is a primary PSU of the multiple PSUs.

In one or more seventeenth embodiments, further to the fifteenth embodiment, the one or more fifth signals comprise a single signal comprising a value which indicates a scale according to which the first voltage level is to indicate the target amount of current.

In one or more eighteenth embodiments, further to the seventeenth embodiment, the value comprises an identifier of a model type of a first PSU.

In one or more nineteenth embodiments, further to the seventeenth embodiment, the value specifies the scale.

In one or more twentieth embodiments, further to the fifteenth embodiment, the scaler circuitry is first scaler circuitry, wherein the transconductance amplifier circuit is a first transconductance amplifier circuit, the device further comprising second scaler circuitry to receive a supply voltage which is provided with the one or more power supply units, and generate a seventh signal based on the supply voltage, wherein a second voltage level of the seventh signal represents a scaled version of a third voltage level of the supply voltage, and a second transconductance amplifier circuit coupled the second scaler circuitry, the second transconductance amplifier circuit to generate an eighth signal based on the seventh signal.

In one or more twenty-first embodiments, further to the twentieth embodiment, the first circuitry is to provide the fourth signal to a voltage regulator, and the second transconductance amplifier circuit is to provide the eighth signal to the voltage regulator.

In one or more twenty-second embodiments, further to the thirteenth embodiment or the fourteenth embodiment, the one or more third signals each comprise a respective bit of a binary value which represents the total number.

In one or more twenty-third embodiments, further to the thirteenth embodiment or the fourteenth embodiment, the system further comprises scaler circuitry to receive a supply voltage which is provided with the one or more power supply units, and generate a fifth signal based on the supply voltage, wherein a second voltage level of the fifth signal represents a scaled version of a third voltage level of the supply voltage, and a transconductance amplifier circuit coupled the scaler circuitry, the transconductance amplifier circuit to generate a sixth signal based on the fifth signal.

In one or more twenty-fourth embodiments, further to the twenty-third embodiment, the first circuitry is to provide the fourth signal to a voltage regulator, and the transconductance amplifier circuit is to provide the sixth signal to the voltage regulator.

In one or more twenty-fifth embodiments, a device comprises first circuitry to receive a first signal from a current share bus that is coupled to each of multiple power supply units (PSUs), wherein a first voltage level of the first signal is to indicate a target amount of current to be output by each of one or more PSUs of the multiple PSUs, generate a second signal based on the first signal, and on one or more third signals which indicate that a first power supply unit (PSU) of the multiple PSUs is a source of the first signal, second circuitry to receive one or more fourth signals which are to indicate, for each PSU of the multiple PSUs, whether the PSU is to participate in a delivery of power to a load, generate, based on the one or more fourth signals, one or more fifth signals which indicate a total number of the one or more PSUs, and third circuitry, coupled to the first circuitry and the second circuitry, to generate a sixth signal by performing an amplification with the second signal based on the one or more fifth signals.

In one or more twenty-sixth embodiments, further to the twenty-fifth embodiment, the third circuitry to perform the amplification based on the one or more fifth signals comprises the third circuitry to perform a transconductance amplification.

In one or more twenty-seventh embodiments, further to the twenty-fifth embodiment or the twenty-sixth embodiment, the one or more third signals comprise multiple signals which each correspond to a different respective one of the multiple PSUs, the multiple signals each to indicate whether the corresponding PSU is a primary PSU of the multiple PSUs.

In one or more twenty-eighth embodiments, further to any of the twenty-fifth through twenty-seventh embodiments, the one or more third signals comprise a single signal comprising a value which indicates a scale according to which the first voltage level is to indicate the target amount of current.

In one or more twenty-ninth embodiments, further to any of the twenty-fifth through twenty-eighth embodiments, the device further comprises fourth circuitry to receive a supply voltage which is provided with the one or more PSUs, and generate a seventh signal based on the supply voltage, wherein a second voltage level of the seventh signal represents a scaled version of a third voltage level of the supply voltage, and fifth circuitry coupled the fourth circuitry, the fifth circuitry to perform a transconductance amplification to generate an eighth signal based on the seventh signal.

In one or more thirtieth embodiments, a method comprises receiving a first signal at first circuitry of a device while the device is coupled between a load and multiple power supply units (PSUs), wherein the device is coupled to each of the multiple PSUs via a bus, wherein the first circuitry receives the first signal via the bus, and wherein a first voltage level of the first signal indicates a target amount of current to be output by each of one or more PSUs of the multiple PSUs, with second circuitry of the device receiving one or more second signals which indicate, for each power supply unit of the multiple PSUs, whether the power supply unit is to participate in a delivery of power to the load, determining, based on the one or more second signals, a total number of the one or more PSUs, and based on the total number, providing one or more third signals which indicate a scale factor, with the first circuitry, generating a fourth signal based on the first signal, comprising performing an amplification based on the scale factor.

In one or more thirty-first embodiments, further to the thirtieth embodiment, performing the amplification based on the scale factor comprises performing a transconductance amplification.

In one or more thirty-second embodiments, further to the thirtieth embodiment or the thirty-first embodiment, the method further comprises with a scaler circuit of the first circuitry receiving one or more fifth signals which identify a first power supply unit (PSU) of the multiple PSUs as a source of the first signal, and amplifying the first signal, based on the one or more fifth signals, to generate a sixth signal, wherein a transconductance amplifier circuit the first circuitry performs the transconductance amplification with the sixth signal.

In one or more thirty-third embodiments, further to the thirty-second embodiment, the one or more fifth signals comprise multiple signals which each correspond to a different respective one of the multiple PSUs, the multiple signals each indicating whether the corresponding PSU is a primary PSU of the multiple PSUs.

In one or more thirty-fourth embodiments, further to the thirty-second embodiment, the one or more fifth signals comprise a single signal comprising a value which indicates a scale according to which the first voltage level is to indicate the target amount of current.

In one or more thirty-fifth embodiments, further to the thirty-fourth embodiment, the value comprises an identifier of a model type of a first PSU.

In one or more thirty-sixth embodiments, further to the thirty-fourth embodiment, the value specifies the scale.

In one or more thirty-seventh embodiments, further to the thirty-second embodiment, the transconductance amplification is a first transconductance amplification, the method further comprising receiving a supply voltage which is provided with the one or more power supply units, generating a seventh signal based on the supply voltage, wherein a second voltage level of the seventh signal represents a scaled version of a third voltage level of the supply voltage, and performing a second transconductance amplification to generate an eighth signal based on the seventh signal.

In one or more thirty-eighth embodiments, further to the thirty-seventh embodiment, the method further comprises providing the fourth signal to a voltage regulator, and providing the eighth signal to the voltage regulator.

In one or more thirty-ninth embodiments, further to any of the thirtieth through thirty-second embodiments, the one or more third signals each comprise a respective bit of a binary value which represents the total number.

In one or more fortieth embodiments, further to any of the thirtieth through thirty-second embodiments, the transconductance amplification is a first transconductance amplification, the method further comprising receiving a supply voltage which is provided with the one or more power supply units, generating a fifth signal based on the supply voltage, wherein a second voltage level of the fifth signal represents a scaled version of a third voltage level of the supply voltage, and performing a second transconductance amplification to generate a sixth signal based on the fifth signal.

In one or more forty-first embodiments, further to the fortieth embodiment, the method further comprises providing the fourth signal to a voltage regulator, and providing the eighth signal to the voltage regulator.

Techniques and architectures for providing power delivery information are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A device comprising:
   first circuitry to couple to each of multiple power supply units (PSUs) including a designated primary PSU via a bus, and to receive a first signal from the bus, wherein a first voltage level of the first signal is to indicate from the primary PSU a target amount of current to be output by each of one or more PSUs of the multiple PSUs; and
   second circuitry coupled to the first circuitry, the second circuitry to:
     receive one or more second signals which are to indicate, for each power supply unit of the multiple PSUs, whether the power supply unit is to participate in a delivery of power to a load;
     determine, based on the one or more second signals, a total number of the one or more PSUs; and
     provide to the first circuitry one or more third signals which indicate a scale factor based on the total number;
   wherein the first circuitry is further to generate a fourth signal based on the first signal, comprising the first circuitry to perform an amplification based on the scale factor.

2. The device of claim 1, wherein the first circuitry to perform the amplification based on the scale factor comprises the first circuitry to perform a transconductance amplification.

3. The device of claim 1, wherein the first circuitry comprises:
   a scaler circuit to:
     receive one or more fifth signals which are to identify the primary power supply unit (PSU) of the multiple PSUs as a source of the first signal; and
     amplify the first signal, based on the one or more fifth signals, to generate a sixth signal; and
   a transconductance amplifier circuit, coupled to the scaler circuit, to perform the transconductance amplification with the sixth signal.

4. The device of claim 3, wherein the one or more fifth signals comprise multiple signals which each correspond to a different respective one of the multiple PSUs, the multiple signals each to indicate whether the corresponding PSU is the primary PSU of the multiple PSUs.

5. The device of claim 3, wherein the one or more fifth signals comprise a single signal comprising a value which indicates a scale according to which the first voltage level is to indicate the target amount of current.

6. The device of claim 5, wherein the value comprises an identifier of a model type of the primary PSU.

7. The device of claim 5, wherein the value specifies the scale.

8. The device of claim 3, wherein the scaler circuitry is first scaler circuitry, and wherein the transconductance amplifier circuit is a first transconductance amplifier circuit, the device further comprising:
   second scaler circuitry to:
     receive a supply voltage which is provided with the one or more power supply units; and
     generate a seventh signal based on the supply voltage, wherein a second voltage level of the seventh signal represents a scaled version of a third voltage level of the supply voltage; and
   a second transconductance amplifier circuit coupled the second scaler circuitry, the second transconductance amplifier circuit to generate an eighth signal based on the seventh signal.

9. The device of claim 8, wherein:
   the first circuitry is to provide the fourth signal to a voltage regulator; and
   the second transconductance amplifier circuit is to provide the eighth signal to the voltage regulator.

10. The device of claim 1, wherein the one or more third signals each comprise a respective bit of a binary value which represents the total number.

11. The device of claim 1, further comprising:
    scaler circuitry to:
      receive a supply voltage which is provided with the one or more power supply units; and
      generate a fifth signal based on the supply voltage, wherein a second voltage level of the fifth signal represents a scaled version of a third voltage level of the supply voltage; and
    a transconductance amplifier circuit coupled the scaler circuitry, the transconductance amplifier circuit to generate a sixth signal based on the fifth signal.

12. The device of claim 11, wherein:
    the first circuitry is to provide the fourth signal to a voltage regulator; and
    the transconductance amplifier circuit is to provide the sixth signal to the voltage regulator.

13. A system comprising:
    multiple power supply units (PSUs) coupled to each other via a bus;
    first circuitry coupled to each of the multiple PSUs via the bus, the first circuitry to receive a first signal from a designated primary PSU on the bus, wherein a first voltage level of the first signal is to indicate a target amount of current to be output by each of one or more PSUs of the multiple PSUs; and
    second circuitry coupled to the first circuitry, the second circuitry to:
      receive one or more second signals which are to indicate, for each power supply unit of the multiple PSUs, whether the power supply unit is to participate in a delivery of power to a load;
      determine, based on the one or more second signals, a total number of the one or more PSUs; and
      provide to the first circuitry one or more third signals which indicate a scale factor based on the total number;
    wherein the first circuitry is further to generate a fourth signal based on the first signal, comprising the first circuitry to perform an amplification based on the scale factor; and
    a display device coupled to the multiple PSUs, the display device to display an image based on a signal communicated with the load.

14. The system of claim 13, wherein the first circuitry to perform the amplification based on the scale factor comprises the first circuitry to perform a transconductance amplification.

15. The system of claim 13, wherein the first circuitry comprises:
a scaler circuit to:
receive one or more fifth signals which are to identify the primary power supply unit (PSU) of the multiple PSUs as a source of the first signal; and
amplify the first signal, based on the one or more fifth signals, to generate a sixth signal; and
a transconductance amplifier circuit, coupled to the scaler circuit, to perform the transconductance amplification with the sixth signal.

16. The system of claim 15, wherein the scaler circuitry is first scaler circuitry, and wherein the transconductance amplifier circuit is a first transconductance amplifier circuit, the device further comprising:
second scaler circuitry to:
receive a supply voltage which is provided with the one or more power supply units; and
generate a seventh signal based on the supply voltage, wherein a second voltage level of the seventh signal represents a scaled version of a third voltage level of the supply voltage; and
a second transconductance amplifier circuit coupled the second scaler circuitry, the second transconductance amplifier circuit to generate an eighth signal based on the seventh signal.

17. A device comprising:
first circuitry to:
receive a first signal from a current share bus that is coupled to each of multiple power supply units (PSUs) including a designated primary PSU, wherein a first voltage level of the first signal, which is from the primary PSU, is to indicate a target amount of current to be output by each of one or more PSUs of the multiple PSUs;
generate a second signal based on the first signal, and on one or more third signals which indicate that the primary power supply unit (PSU) of the multiple PSUs is a source of the first signal;
second circuitry to:
receive one or more fourth signals which are to indicate, for each PSU of the multiple PSUs, whether the PSU is to participate in a delivery of power to a load;
generate, based on the one or more fourth signals, one or more fifth signals which indicate a total number of the one or more PSUs; and
third circuitry, coupled to the first circuitry and the second circuitry, to generate a sixth signal by performing an amplification with the second signal based on the one or more fifth signals.

18. The device of claim 17, wherein the third circuitry to perform the amplification based on the one or more fifth signals comprises the third circuitry to perform a transconductance amplification.

19. The device of claim 17, wherein the one or more third signals comprise multiple signals which each correspond to a different respective one of the multiple PSUs, the multiple signals each to indicate whether the corresponding PSU is the primary PSU of the multiple PSUs.

20. The device of claim 17, further comprising:
fourth circuitry to:
receive a supply voltage which is provided with the one or more PSUs; and
generate a seventh signal based on the supply voltage, wherein a second voltage level of the seventh signal represents a scaled version of a third voltage level of the supply voltage; and
fifth circuitry coupled the fourth circuitry, the fifth circuitry to perform a transconductance amplification to generate an eighth signal based on the seventh signal.

* * * * *